US011831323B2

(12) United States Patent
Van Ierssel et al.

(10) Patent No.: US 11,831,323 B2
(45) Date of Patent: Nov. 28, 2023

(54) METHODS AND CIRCUITS FOR REDUCING CLOCK JITTER

(71) Applicant: Cadence Design Systems, Inc., San Jose, CA (US)

(72) Inventors: Marcus Van Ierssel, Toronto (CA); Prabhnoor Singh Kainth, Toronto (CA); Nanyan Wang, Cupertino, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 17/719,974

(22) Filed: Apr. 13, 2022

(65) Prior Publication Data

US 2022/0329247 A1    Oct. 13, 2022

Related U.S. Application Data

(60) Provisional application No. 63/174,093, filed on Apr. 13, 2021.

(51) Int. Cl.
*H04L 7/00* (2006.01)
*H03L 7/107* (2006.01)
*H03L 7/093* (2006.01)
*H03L 7/08* (2006.01)
*H04L 7/02* (2006.01)

(52) U.S. Cl.
CPC .......... *H03L 7/1075* (2013.01); *H03L 7/0807* (2013.01); *H03L 7/093* (2013.01); *H04L 7/0079* (2013.01); *H04L 7/02* (2013.01)

(58) Field of Classification Search
CPC ..... H03L 7/1075; H03L 7/093; H03L 7/0807; H03L 7/0814; H04L 7/0079; H04L 7/02; H04L 7/0337
USPC ................................ 375/355, 373, 375, 376
See application file for complete search history.

(56) References Cited

U.S. PATENT DOCUMENTS

| | | |
|---|---|---|
| 6,963,232 B2 | 11/2005 | Frans et al. |
| 7,084,681 B2 | 8/2006 | Green et al. |
| 7,269,212 B1 | 9/2007 | Chau et al. |
| 7,308,048 B2 | 12/2007 | Wei |
| 7,336,749 B2 | 2/2008 | Garlepp |
| 7,714,643 B1 | 5/2010 | Wang et al. |
| 8,310,294 B2 | 11/2012 | Poulton et al. |
| 8,352,772 B2 | 1/2013 | Kizer et al. |
| 8,548,110 B2 | 10/2013 | Lin et al. |
| 8,553,473 B2 | 10/2013 | Kim et al. |
| 8,670,512 B1 | 3/2014 | Wang |

(Continued)

OTHER PUBLICATIONS

Kundert, "Modeling and Simulation of Jitter in Phase-Locked Loops," Cadence Design Systems, Apr. 14, 2005 (21 pages).

(Continued)

*Primary Examiner* — Phuong Phu
(74) *Attorney, Agent, or Firm* — Mark Whittenberger, Esq.; Holland & Knight LLP

(57) ABSTRACT

A clock-and-data recovery circuit for serial receiver includes a jitter meter and an adaptive loop gain adjustment circuitry. The clock-recovery circuitry phase aligns a clock signal to the incoming data. A jitter meter provides a measure of jitter, while adaptation circuitry uses the measure to adjust the clock-recovery circuitry in a manner that reduces clock jitter. The jitter measure can be a ratio of errors associated with different inter-symbol slew rates.

18 Claims, 5 Drawing Sheets

(56) References Cited

U.S. PATENT DOCUMENTS

| | | | |
|---|---|---|---|
| 9,036,764 | B1 | 5/2015 | Hossain et al. |
| 9,091,711 | B1 | 7/2015 | Wang |
| 9,209,966 | B1 | 12/2015 | Hossain et al. |
| 9,768,947 | B2 | 9/2017 | Hossain et al. |
| 10,142,089 | B2 | 11/2018 | Yao et al. |
| 10,212,008 | B2 | 2/2019 | Palmer |
| 10,291,440 | B2 | 5/2019 | Farjad-Rad |
| 10,411,924 | B2 | 9/2019 | Wang et al. |
| 10,530,619 | B2 | 1/2020 | Palmer |
| 10,637,696 | B2 | 4/2020 | Hossain |
| 10,673,535 | B2 | 6/2020 | Li et al. |
| 10,728,063 | B2 | 7/2020 | Wang |
| 2004/0223571 | A1* | 11/2004 | Donnelly ............. H03L 7/0814 375/371 |
| 2008/0152057 | A1* | 6/2008 | Lee ..................... H04L 7/0337 375/346 |
| 2013/0322506 | A1 | 12/2013 | Zerbe et al. |

OTHER PUBLICATIONS

Lee et al., "Design of 56 Gb/s NRZ and PAM4 SerDes Transceivers in CMOS Technologies," IEEE Journal of Solid-State Circuits, vol. 50, No. 9, Sep. 2015 (13 Pages).

Peterson, "An Overview of Integral Gain," retrieved from https://control.com/technical-articles/integral-windup-method-in-pid-control/, Jul. 24, 2020 (4 Pages).

Powersim, "Tutorial Implementation and Design of PLL and Enhanced PLL Blocks," published by Powersim Inc. in Apr. 2020 (28 pages).

Tektronix, "PAM4 Signaling in High Speed Serial Technology: Test, Analysis, and Debug," Rev. 01/16 published by Tektronix in 2016 (28 pages).

Wikipedia, "Jitter," retrieved from https://en.wikipedia.org/w/index.php?title=Jitter&oldid=1007060764 and last edited Feb. 16, 2021 (7 pages).

Wikipedia, "Slew rate," retrieved from https://en.wikipedia.org/w/index.php?title=Slew_rate&oldid=997891521 and last edited Jan. 2, 2021 (3 pages).

* cited by examiner

METHODS AND CIRCUITS FOR REDUCING CLOCK JITTER

BACKGROUND

Binary communication systems represent information using just two symbols—e.g. relatively high and low voltages—to alternatively represent a logical one and a logical zero (i.e. 1b or 0b, where "b" is for binary). The number of levels used to represent digital data is not limited to two, however. For example, a type of signaling referred to as PAM-4 (for 4-level pulse-amplitude modulation) uses four separate pulse amplitudes (voltages) to convey two binary bits of data per symbol (i.e., 00b, 01b, 10b, or 11b). A series of symbols can thus be communicated as a changing voltage or current that transitions between levels in a manner that reflects the series. The time each signal level is held to represent a symbol is termed the "symbol duration time" or "unit interval." The speed with which symbols can be communicated is termed the "symbol rate," which can be expressed in units of symbols per second, or "baud." A receiver recovers a set of symbols from a signal by comparing the signal level during each symbol time against one or more reference levels to distinguish between symbols.

Systems can communicate symbols serially—one symbol at a time over a single channel—or in parallel—multiple symbols simultaneously over multiple channels. Parallel communication can be fast but serial systems have long been preferred for communicating over long distances due to the cost of cabling and the difficulty of maintaining synchronization between parallel signals. The trend has been to employ serial interfaces at ever smaller scales.

A receiver of a serial signal (a serial receiver) samples each incoming symbol at the symbol rate and at or near the center of each symbol. In a process called "clock recovery," the receiver aligns a clock signal with the incoming data symbols. The clock signal alternates between high and low levels at the symbol rate with the level transitions, or "edges," synchronized to the symbols. The receiver compares each symbol's level against one or more reference levels and samples the comparison in time with a corresponding clock edge to produce a series of digital samples, a digital data stream that represents the incoming symbols.

Poorly timed clock edges lead to sample errors. Clock-recovery circuits employ a circuit called a "phase-locked loop" (PLL) to phase align the clock edges to the data symbols. PLLs suffer from phase noise, or "jitter," in which the clock edges deviate from perfect periodicity and are thus misaligned to varying degrees with respect to the data symbols to be sampled. PLL jitter introduces sample errors and limits symbol rates. There is therefore a need for methods and circuits for reducing PLL jitter.

BRIEF DESCRIPTION OF THE DRAWINGS

The detailed description is illustrated by way of example, and not by way of limitation, in the figures of the accompanying drawings and in which like reference numerals refer to similar elements and in which.

DETAILED DESCRIPTION

Figure 1:
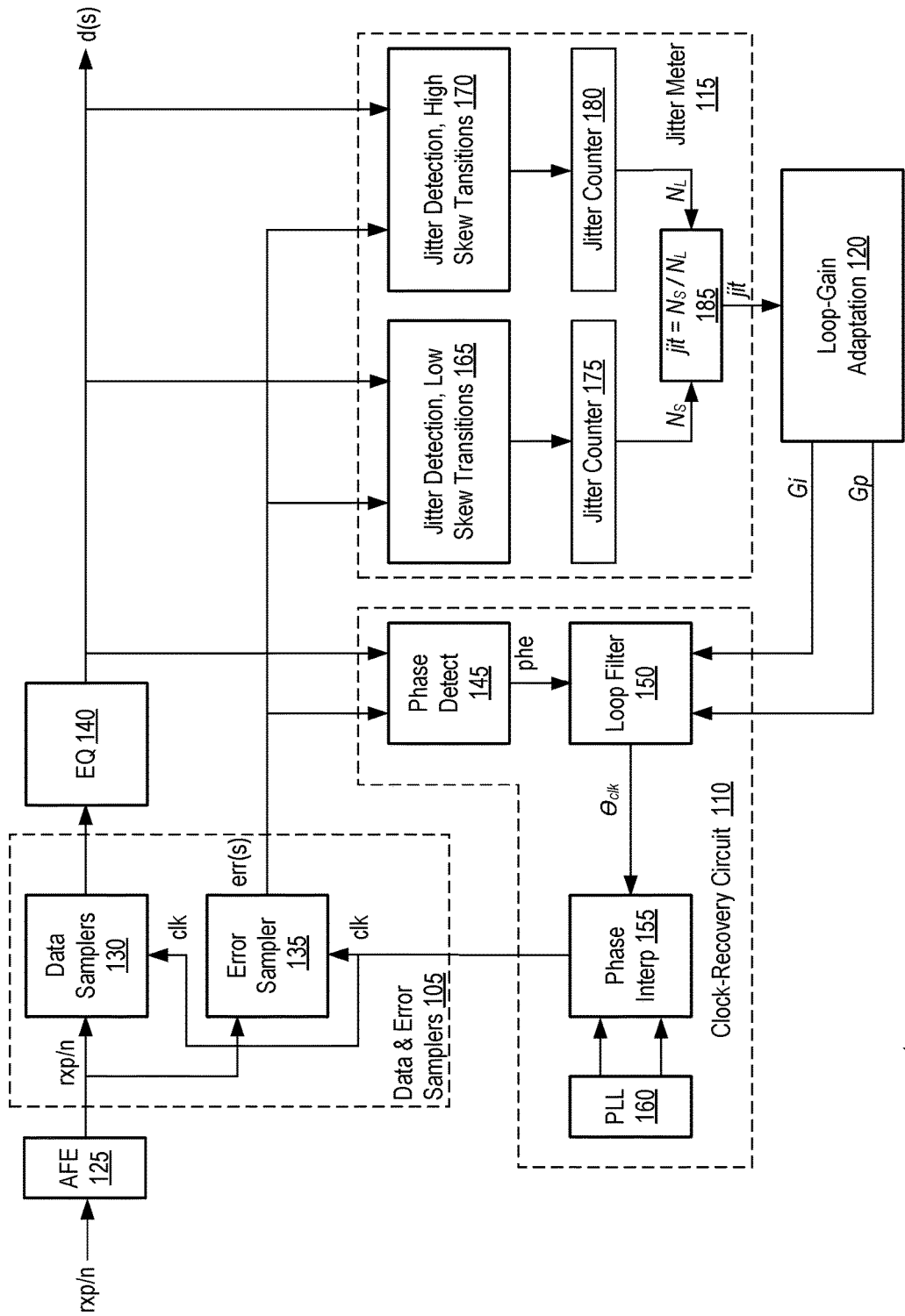
FIG. 1 depicts a serial receiver 100 with data and error samplers 105 that sample an input signal rxp/n on edges of a clock signal clk to provide data samples d(s) and error sample err(s).

FIG. 1 depicts a serial receiver 100 with data and error samplers 105 that sample an input signal rxp/n on edges of a clock signal clk to provide data samples d(s) and error sample err(s). Clock-recovery circuit 110 recovers clock signal clk from the data and error samples but does so imperfectly, in part because clock signal clk exhibits jitter. A jitter meter 115 produces a jitter measure jit from the data and error samples. Adaptation logic 120 employs the jitter measure to produce adjustments for proportional control gain Gp and integral control gain Gi that cause clock-recovery circuit 110 to reduce the clock jitter. Jitter meter 115 advantageously provides a direct measure of jitter using errors associated with different inter-symbol slew rates. The errors are sampled using relatively area- and power-efficient structures and methods that can leverage existing data- and clock-recovery circuitry.

Input signal rxp/n, received on a like-identified input node, is a PAM-4 signal in this example. Four different pulse amplitudes convey two binary bits of data per symbol. An analog front-end (AFE) 125 conditions the signal using e.g. a continuous-time linear equalizer and voltage gain amplifier to interface with the incoming channel. Data samplers 130 sample each symbol in the conditioned input signal against three reference levels that divide the range of the input signals into four regions, each region corresponding to two binary bits (e.g., 00b=0, 01b=1, 10b=2, or 11b=3). An error sampler 135 samples symbols relative to an error level set, as detailed below, to indicate whether edges of clock signal clk are early or late relative to the incoming symbols. A digital equalizer 140 can be included to reduce or enhance selected frequency components of the digitized data d(s).

Clock-recovery circuit 110 includes a phase detector 145, a loop filter 150, a phase interpolator 155, and a phase-locked loop (PLL) 160. Phase detector 145 compares data and error samples d(s) and err(s) to determine whether the phase of clock signal clk is early or late relative to the incoming symbols of signal rxp/n and develops a phase-error signal phe proportional to the error. Loop filter 150 filters phase-error signal phe to issue a phase-adjustment signal $\theta_{clk}$ to phase interpolator 155, which mixes clock signals of various phases from PLL 160 to phase adjust clock signal clk in a manner that reduces phase-error signal phe and thus aligns edges of clock signal clk with the incoming symbols. Loop filter 150 applies proportional and integral gains to phase-error signal phe in deriving phase-adjustment signal $\theta_{clk}$. Proportional gain refers to an amplification factor proportional to the degree to which clock edges are misaligned with the incoming symbols; integral gain refers to an amplification factor based on clock-phase errors that accumulate over time. The values of both proportional and integral gain contribute to clock jitter. Adaptation logic 120 issues control signals Gp and Gi to loop filter 150 to control the proportional gain and integral gain, respectively, in a manner that minimizes clock jitter.

Jitter meter 115 issues a jitter measure jit that allows adaptation logic 120 to derive control signals Gp and Gi for loop filter 150. Jitter meter 115 includes a pair of jitter detectors 165 and 170 with respective counters 175 and 180 and a ratio circuit 185. Jitter detector 165 detects data patterns for which adjacent symbols exhibit a first slew rate—in this example a relatively low change of voltage over one unit interval—and associates these patterns with corresponding error samples err(s). Counter 175 accumulates a count NS of these pattern/error correspondences over a test window for jitter measurement. Jitter detector 170 detects data patterns for which adjacent symbols exhibit a second slew rate—a relatively high change of voltage over one unit interval—and associates these patterns with corresponding error samples err(s). Counter 180 accumulates a count NL of these pattern/error correspondences over the same test window used for Counter 175. Jitter measure jit, a normalized measure of jitter amplitude, is the ratio of jitter counts NS and NL.

Figure 2:
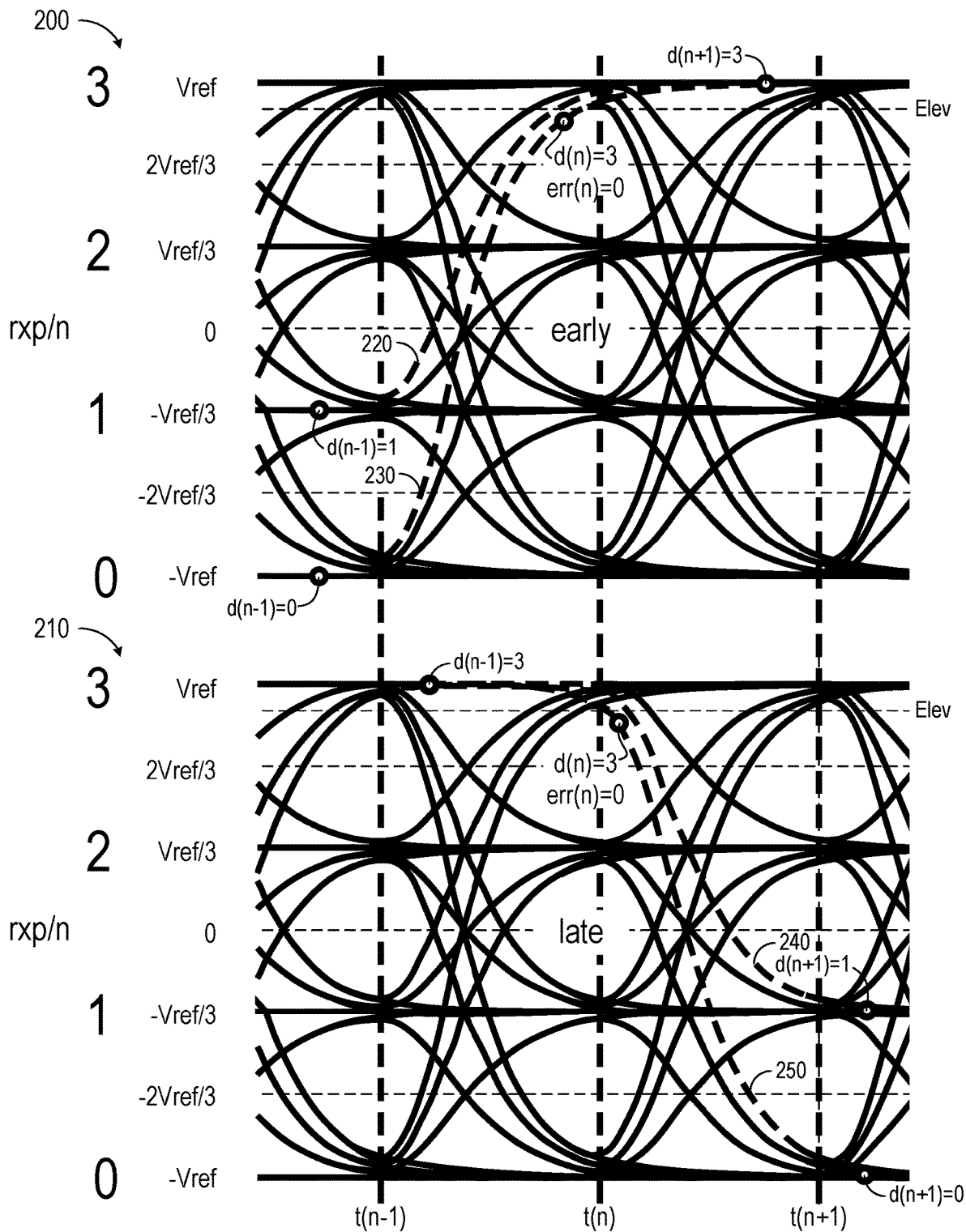
FIG. 2 depicts a pair of eye diagrams 200 and 210 that illustrate how jitter meter 115 produces jitter measure jit.

FIG. 2 depicts a pair of eye diagrams 200 and 210 that illustrate how jitter meter 115 produces jitter measure jit. Each eye diagram represents voltage paths of signal rxp/n in a PAM-4 embodiment in which the input signal transitions between positive and negative reference voltages Vref and −Vref and is centered on zero volts (0V). Levels above 2Vref/3 represent a decimal value of 3 (11b), between 0V and 2Vref/3 a decimal value of 2 (10b), between 0V and −2Vref/3 a decimal value of 1 (01b), and below −2Vref/3 a decimal value of 0 (00b). The three levels that distinguish the four symbol types are provided to data samplers 130 to allow them to issue a two-bit digital value for each incoming symbol. The sample level Elev for error sampler 135 is set near the upper boundary of the symbol range, which allows phase detector 145 to determine whether the phase of clock signal clk is early or late relative to the incoming symbols. As we will see, error samples err(s) can also be correlated to signal transitions with different slew rates to derive a measure of jitter.

Turning first to diagram 200, signal paths for two data patterns are highlighted using dashed lines, path 220 for data pattern d(n−1,n,n+1)=1,3,3 and path 230 for data pattern d(n−1,n,n+1)=0,3,3. The slew rate of the transition in path 220 is lower than for path 230 because of the smaller voltage change over a unit interval. Consequently, paths 220 and 230 tend to cross error level Elev at different times on average. In diagram 210, a highlighted path 240 is for data pattern d(n−1,n,n+1)=3,3,1 and a path 250 for data pattern d(n−1,n,n+1)=3,3,0. In this case, the slew rate for path 240 is lower than for path 250 so the latter tends to cross error level Elev sooner on average. Small circles in FIG. 2 illustrate hypothetical sample points (time and voltage) that are early or late relative to one of three ideal sample instants t(n−1), t(n), and t(n+1).

Considering only paths 230 and 250, phase detector 145 detects an early clock edge if data d(n)=3 and err(n)=0 for low-to-high symbol transitions and a late clock edge if data d(n)=3 and err(n)=0 for high-to-low symbol transitions. Clock edges can be early or late relative to an ideal sample instant highlighted here with vertical dashed lines at time t(n). Clock jitter causes sample instants to vary randomly before and after the ideal sample instants.

Figure 3:
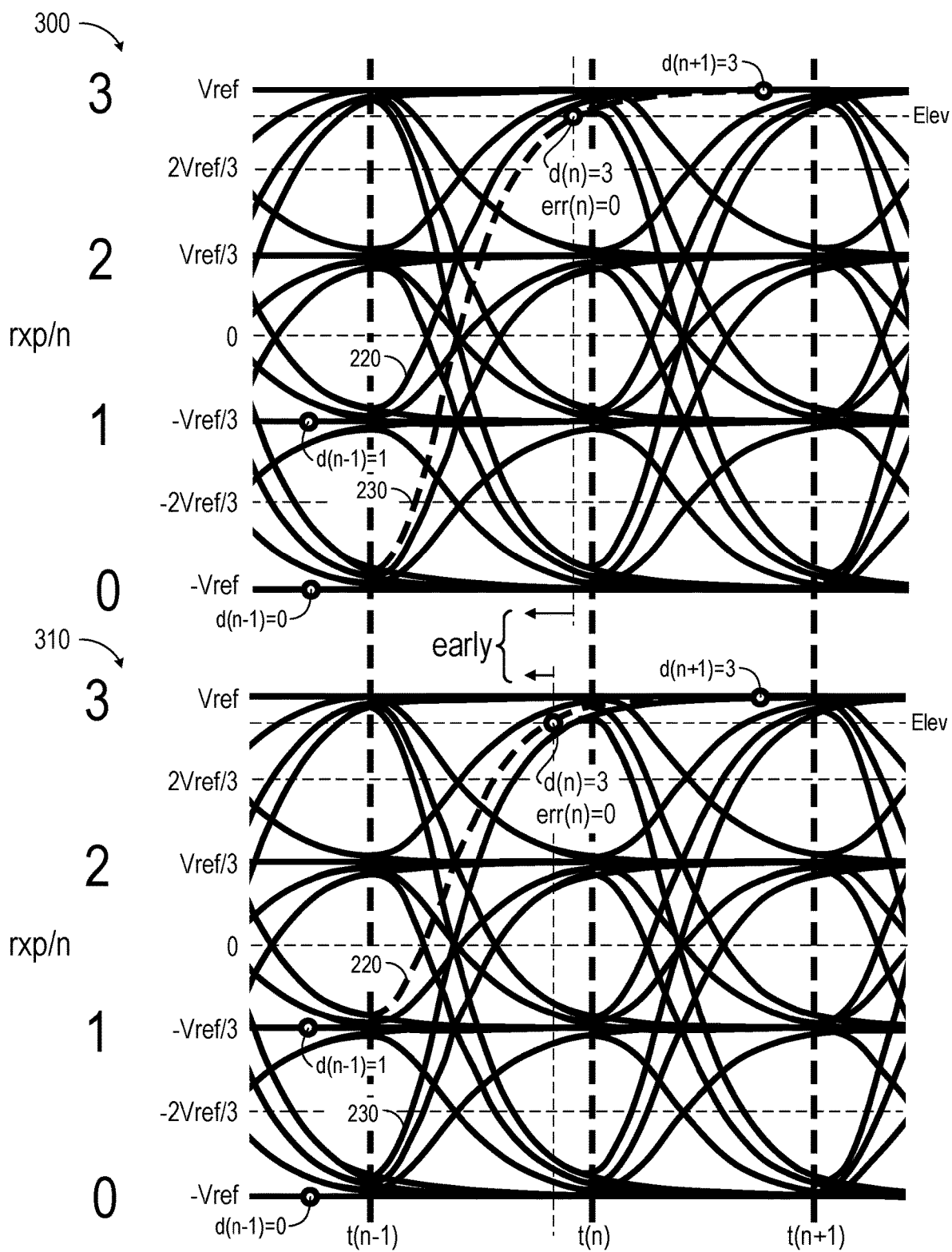
FIG. 3 depicts eye diagrams 300 and 310 that are the same as those of FIG. 2 but highlighted differently to illustrate how jitter meter 115 detects and measures jitter.

FIG. 3 depicts eye diagrams 300 and 310 that are the same as those of FIG. 2 but highlighted differently to illustrate how jitter meter 115 detects and measures jitter. Path 230, highlighted in diagram 300, crosses error level Elev later than path 220, highlighted in diagram 310. Smaller perturbations in clock-edge timing will yield an error for path 220 so symbol pattern 0,3,3 is more susceptible to jitter-induced errors than pattern 1,3,3. The ratio of errors associated with the less-jitter-sensitive pattern 1,3,3 to errors associated with the more-jitter-sensitive pattern 0,3,3 provides a measure of jitter amplitude. The more often errors occur with the low slew rate path 220 relative to the high slew rate path 230, the greater the amplitude of the clock jitter.

Returning to FIG. 1, jitter detector 165 senses the data pattern 1,3,3 associated with the shorter transition (lower slew rate) and employs counter 175 to accumulate the number of times $N_S$ that pattern is associated with an error. Jitter detector 170 senses the data pattern 0,3,3 associated with the longer transition (higher slew rate) and employs counter 180 to accumulate the number of times $N_L$ that pattern is associated with an error. Ratio circuit 185 calculates jitter amplitude jit as the ratio $N_S/N_L$, the higher the amplitude the higher the jitter. Loop-gain adaptation circuitry 120 adjust signals Gp and Gi as necessary to minimize the ratio of slew-rate-specific error samples $N_S/N_L$, expressed here as jitter amplitude jit, by e.g. exploring the ranges of values for signals Gp and Gi to find the optimum settings. While the ratio of slew-rate-specific error samples is the figure of merit in this example, other figures of merit (e.g. other measures of jitter) can be used in other embodiments.

The computations associated with jitter meter 115 and adaptation logic 120 can be carried out by circuitry integrated with other receiver components. In other embodiments the receiver can pass data and error samples to off-chip firmware that calculates and returns gain-adjustment signals. The receiver can include registers for passing variables to and from the firmware. Furthermore, while the example of FIG. 3 uses early samples associated with two symbol-transition types to measure jitter, other embodiments can consider more and/or different types of early or late transitions.

Figure 4:
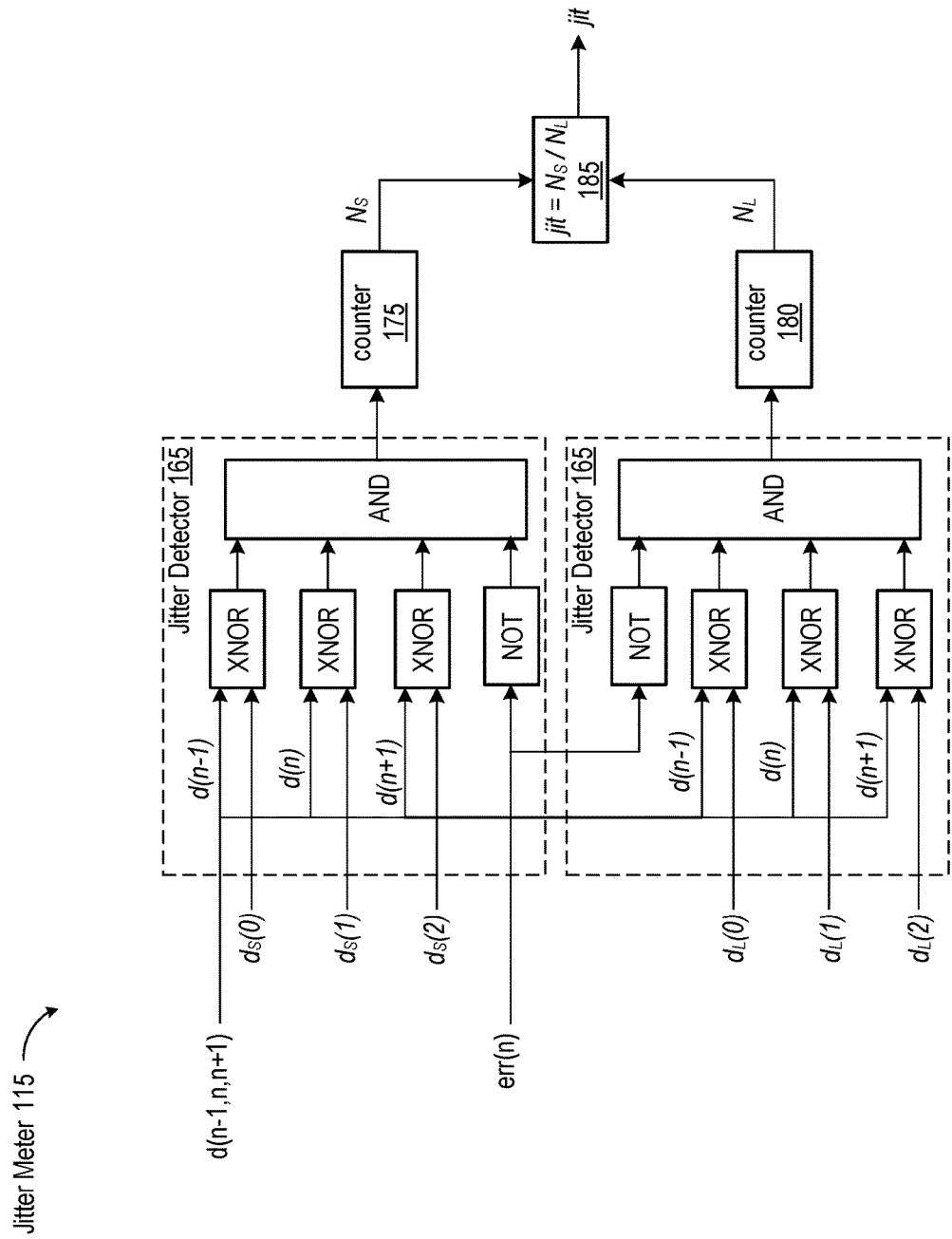
FIG. 4 illustrates an embodiment of jitter meter 115 of FIG. 1. Jitter detectors 165 and 170 are physically the same.

FIG. 4 illustrates an embodiment of jitter meter 115 of FIG. 1. Jitter detectors 165 and 170 are physically the same. Each receives a three-symbol pattern, respectively $d_S(2:0)$ and $d_L(2:0)$, each symbol of which is treated to an exclusive NOR function for comparison with a corresponding symbol of incoming symbol patterns d(2:0). An AND function increments the respective jitter counter when the patterns match and the value of error signal err(n) is zero. Counters 175 and 180 can be allowed to count over any desired number of clock cycles—the sample period—to allow ratio circuit 185 to compute an accurate normalized jitter amplitude jit.

Figure 5:
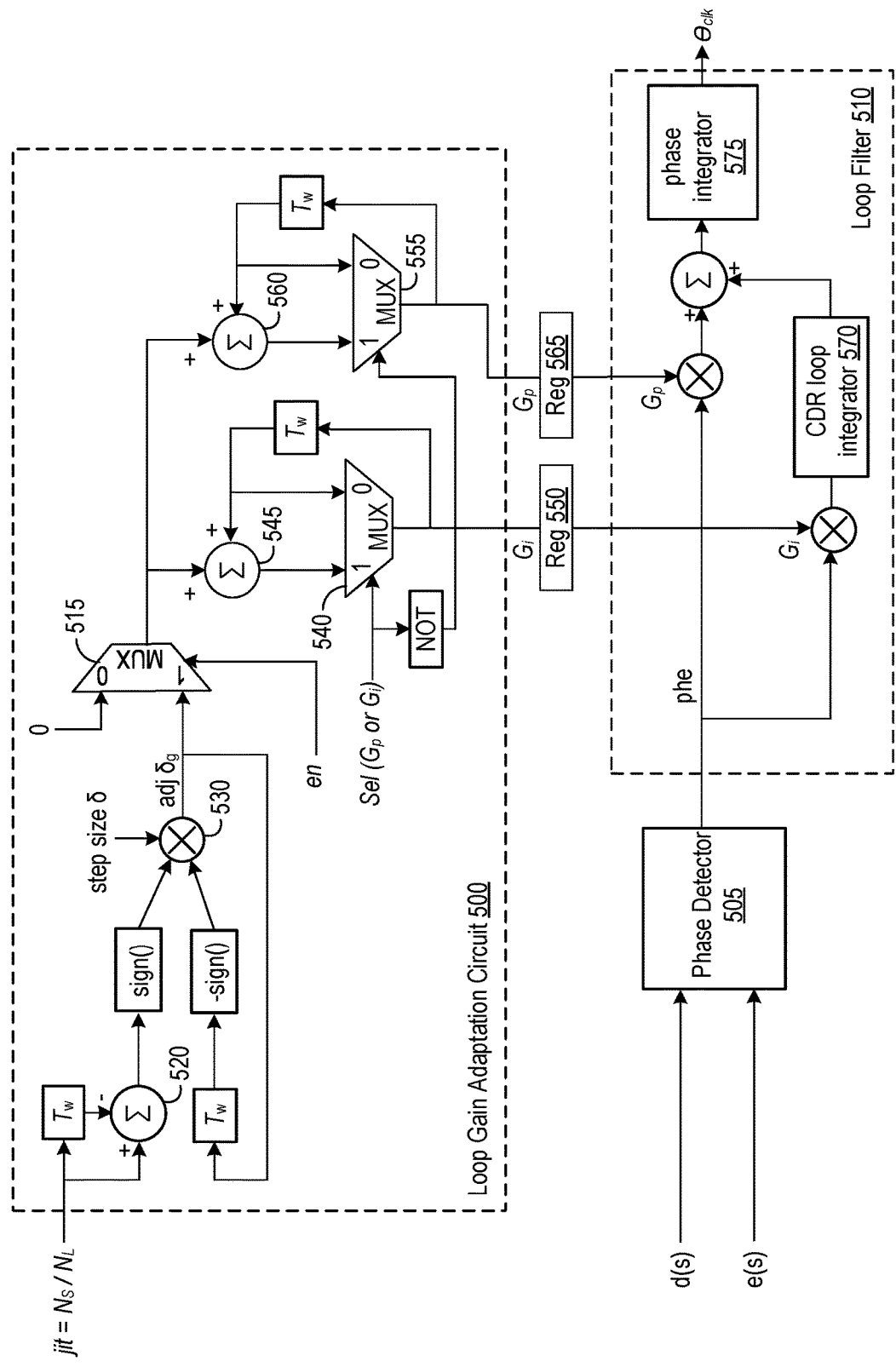
FIG. 5 illustrates embodiments of a loop-gain adaptation circuit 500, a phase detector 505, and a loop filter 510 that serve as loop-gain adaptation circuit 120, phase detector 145, and loop filter 150 in receiver 100 of FIG. 1.

FIG. 5 illustrates embodiments of a loop-gain adaptation circuit 500, a phase detector 505, and a loop filter 510 that serve as loop-gain adaptation circuit 120, phase detector 145, and loop filter 150 in receiver 100 of FIG. 1. Loop-gain adaptation circuit 500 includes separate but similar signal paths for calibrating integral-gain signal Gi and proportional-gain signal Gp as a function of normalized jitter amplitude jit. A multiplexer 515 disables both paths, to save power for example, when an enable signal en is not asserted. The following discussion presumes enable signal en is asserted.

Jitter amplitude jit is conveyed to a summing node or circuit 520 both directly and via a delay element $T_W$ (for "test window") that delays application of the jitter amplitude for an interval between loop-gain updates. Sign elements and a multiplier 530 produce a gain adjustment $$\delta g = -\text{sign}(\delta g(t - T_W)) * \text{sign}\left[\frac{N_S}{N_L}(t) - \frac{N_S}{N_L}(t - T_W)\right] * \delta,$$

where $$\frac{N_S}{N_L}$$

is the jitter amplitude represented by signal $$jit\left(\frac{N_S}{N_L} = jit\right)$$

and δ is the adjustment step size. To calibrate integral gain Gi, a select signal Sel is asserted so that a multiplexer 540 and a summing node 545 add gain adjustment δg to the gain setting Gi from the prior test window. The resulting gain setting Gi is loaded into a register 550 and applied to loop filter 510. Calibration is performed until signal jit is minimized for gain setting Gi. To calibrate proportional gain Gp, select signal Sel is de-asserted so that a multiplexer 555 and a summing node 560 add gain adjustment δg to the gain setting Gp from the prior test window. The resulting gain setting Gp is loaded into a register 565 and applied to loop filter 510. Calibration is once again performed until the jitter amplitude jit, measured as the ratio of sampled slew rates $$\frac{N_S}{N_L}$$

in this embodiment, is minimized. Calibration of one or both gain settings can be repeated as needed. Some embodiments monitor clock jitter to trigger recalibration.

Loop filter 510 generates phase adjustment signal θclk responsive to phase-error signal phe and as a function of gain settings Gp and Gi. Gain setting Gi affects the input to a loop integrator 570. Gain setting Gp and the output of loop integrator 570 affect the input of a phase integrator 575. The workings of loop filter 510 are well known so a detailed discussion is omitted.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single ended may also be differential, and vice versa. Similarly, signals described or depicted as having active-high or active-low logic levels may have opposite logic levels in alternative embodiments, and digital signals describes as PAM4 can express symbols using more or fewer values. Therefore, the spirit and scope of the appended claims should not be limited to the foregoing description. Only those claims specifically reciting "means for" or "step for" should be construed in the manner required under the sixth paragraph of 35 U.S.C. § 112.

An output of a process for designing an integrated circuit, or a portion of an integrated circuit, comprising one or more of the circuits described herein may be a computer-readable medium. The computer-readable medium may be encoded with data structures or other information describing circuitry that may be physically instantiated as an integrated circuit or portion of an integrated circuit. Various formats may be used for such encoding. Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

What is claimed is:

1. A method comprising:
   sampling a sequence of symbols on edges of a clock signal to produce a sequence of data samples, the sequence of data samples exhibiting a first sample pattern and a second sample pattern, the clock signal exhibiting a clock phase and a clock frequency;
   generating a phase-error signal responsive to the symbols and the clock signal;
   amplifying the phase-error signal by a gain factor to produce a control signal;
   adjusting at least one of the clock phase and the clock frequency responsive to the control signal;
   sampling at least a subset of the symbols to produce a sequence of error samples;
   counting a first number of the error samples correlated with the first sample pattern;
   counting a second number of the error samples correlated with the second sample pattern; and
   adjusting the gain factor responsive to the first number of the error samples and the second number of the error samples.

2. The method of claim 1, wherein each symbol in the sequence of symbols represents multiple bits.

3. The method of claim 1, wherein the first pattern consists of three consecutive symbol levels.

4. The method of claim 1, wherein adjusting the gain factor comprises writing a gain-factor value to a register.

5. The method of claim 1, further comprising writing the first number of the error samples to a first register and the second number of the error samples to a second register.

6. The method of claim 5, further comprising reading the first number of the error samples from the first register, reading the second number of the error samples from the second register, and calculating a new gain factor from the first number and the second number, wherein adjusting the gain factor comprises writing the new gain factor to a third register.

7. A receiver comprising:
   an input node to receive an input signal expressing a series of symbols, the series of symbols having a first symbol pattern in which a first pair of adjacent symbols includes a first transition of a first slew rate and a second symbol pattern in which a second pair of adjacent symbols includes a second transition at a second slew rate different from the first slew rate;
   a data sampler to produce data samples from the series of symbols, the data sampler to sample the symbols in time to a clock signal;
   an error sampler to produce error samples from the series of symbols;

a clock-recovery circuit having a loop filter that exhibits a loop-filter gain, the clock-recovery circuit to recover the clock signal from the data samples and the error samples; and a jitter detector to detect first jitter associated with the first slew rate and second jitter associated with the second slew rate.

8. The receiver of claim 7, further comprising loop-gain adaptation logic to adjust the loop-filter gain responsive to the first jitter and the second jitter.

9. The receiver of claim 8, wherein the data sampler, the error sample, and the clock-recovery circuit are instantiated on an integrated circuit, the integrated circuit further comprising an interface to communicate with at least a portion of the loop-gain adaptation logic instantiated off the integrated circuit.

10. The receiver of claim 8, the jitter detector to accumulate first instances of the first jitter and second instances of the second jitter, the loop-gain adaptation to adjust the loop-filter gain responsive to a ratio of first instances to the second instances.

11. The receiver of claim 10, wherein the loop-filter gain comprises proportional gain, the loop-gain adaptation to further adjust an integral gain of the loop filter responsive to the first jitter and the second jitter.

12. The receiver of claim 7, the jitter detector further comprising a first counter to count instances of the first jitter and a second counter to count instances of the second jitter.

13. The receiver of claim 7, the jitter detector detecting the first jitter by relating a first pattern of the data samples to the error samples and the second jitter by relating a second pattern of the data samples to the error samples.

14. The receiver of claim 7, wherein each of the symbols expresses at least two binary bits of data.

15. The receiver of claim 7, the first slew rate comprising a first change of voltage between the first pair of adjacent symbols and the second slew rate a second change of voltage between the second pair of adjacent symbols and greater than the first change of voltage.

16. A method of controlling a loop gain of a filter on an integrated circuit, the method comprising:

receiving, from the integrated circuit, a first number of slew-rate samples corresponding to a first inter-symbol slew rate;

receiving, from the integrated circuit, a second number of slew-rate samples corresponding to a second inter-symbol slew rate;

calculating a loop-gain adjustment from the first number and the second number;

transmitting the loop-gain adjustment to the integrated circuit; and correlating the slew-rate samples of the first number of slew-rate samples with first errors and correlating the slew-rate samples of the second number of slew-rate samples with second errors;

wherein calculating the loop-gain adjustment from the first number and the second number comprises taking a ratio of the slew-rate samples correlated with the first errors to the slew-rate samples correlated with the second errors.

17. The method of claim 16, wherein the receiving of at least one of the first number and the second number comprises reading a register on the integrated circuit.

18. The method of claim 16, further comprising writing the loop-gain adjustment to a register on the integrated circuit.

* * * * *